United States Patent [19]
Cernea et al.

[11] Patent Number: 5,596,532
[45] Date of Patent: Jan. 21, 1997

[54] FLASH EEPROM SELF-ADAPTIVE VOLTAGE GENERATION CIRCUIT OPERATIVE WITHIN A CONTINUOUS VOLTAGE SOURCE RANGE

[75] Inventors: Raul-Adrian Cernea, Santa Clara; Douglas J. Lee, San Jose; Mehrdad Mofidi, Fremont; Sanjay Mehrotra, Milpitas, all of Calif.

[73] Assignee: SanDisk Corporation, Sunnyvale, Calif.

[21] Appl. No.: 544,456

[22] Filed: Oct. 18, 1995

[51] Int. Cl.$^6$ .................................................. G11C 16/00
[52] U.S. Cl. .............................. 365/185.18; 365/185.33; 365/189.07; 365/226
[58] Field of Search .................. 365/185.18, 185.20, 365/189.07, 189.09, 226, 185.33, 189.11; 327/536, 538, 539, 540

[56] References Cited

U.S. PATENT DOCUMENTS

| | | | |
|---|---|---|---|
| 5,267,218 | 11/1993 | Elbert | 365/226 |
| 5,268,871 | 12/1993 | Dhong et al. | 365/189.07 |
| 5,276,646 | 1/1994 | Kim et al. | 365/189.09 |
| 5,426,391 | 6/1995 | Tedrow et al. | 327/530 |
| 5,436,587 | 7/1995 | Cernea | 327/536 |
| 5,444,412 | 8/1995 | Kowalski | 365/189.07 |
| 5,446,697 | 8/1995 | Yoo et al. | 365/189.09 |
| 5,508,971 | 4/1996 | Cernea et al. | 365/185.23 |
| 5,511,026 | 4/1996 | Cleveland et al. | 365/189.09 |

*Primary Examiner*—Tan T. Nguyen
*Attorney, Agent, or Firm*—Majestic, Parsons, Siebert & Hsue

[57] ABSTRACT

An EEPROM system operative within a continuous source voltage range includes a controller having a processor and a memory, and an EEPROM module connected to the controller and including a plurality of EEPROM chips. A representative one of the EEPROM chips includes a comparator, a programmable voltage generator, and a regulated charge pump circuit. The comparator compares a source voltage provided to the EEPROM system against one or more reference voltages indicative of subranges within the operative source voltage range, to generate one or more control signals indicative of the subrange within which the source voltage resides. The regulated charge pump circuit generates from the source voltage, a regulated high voltage output which is substantially unaffected by changes in the source voltage. Included in the regulated charge pump circuit are a feedback circuit, and an open loop gain adjustment circuit which is responsive to the the one or more control signals generated by the comparator. The programmable voltage generator is programmed by the controller to generate a plurality of specified voltages for programming, reading, and erasing selected EEPROM cells in the EEPROM chip. To adjust for changes in the source voltage provided to the EEPROM system, the controller requests the one or more control signals generated from the comparator, and modifies values programmed into the programmable voltage generator accordingly.

34 Claims, 13 Drawing Sheets

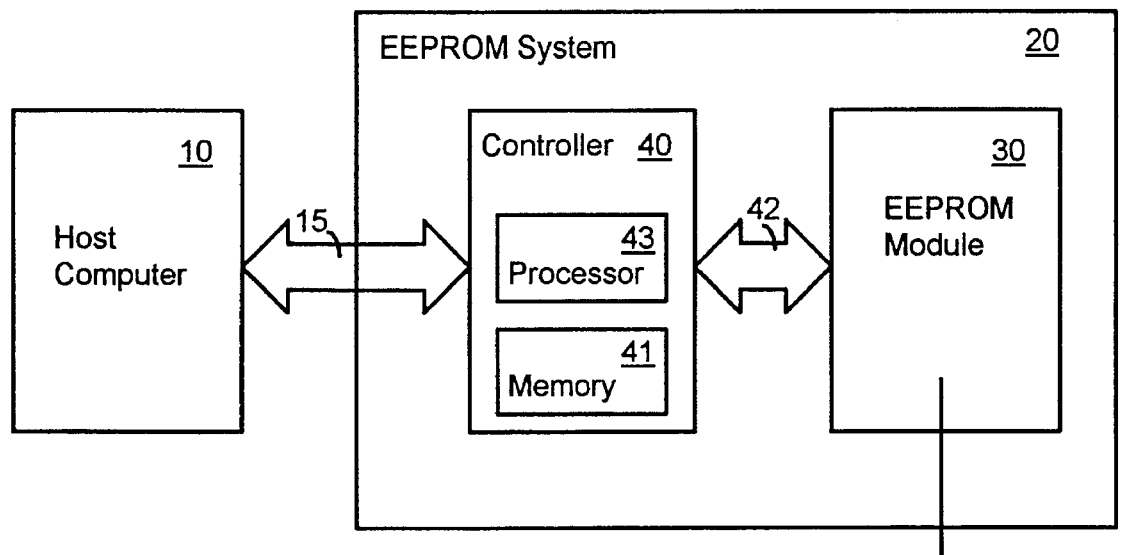
*fig.1a*
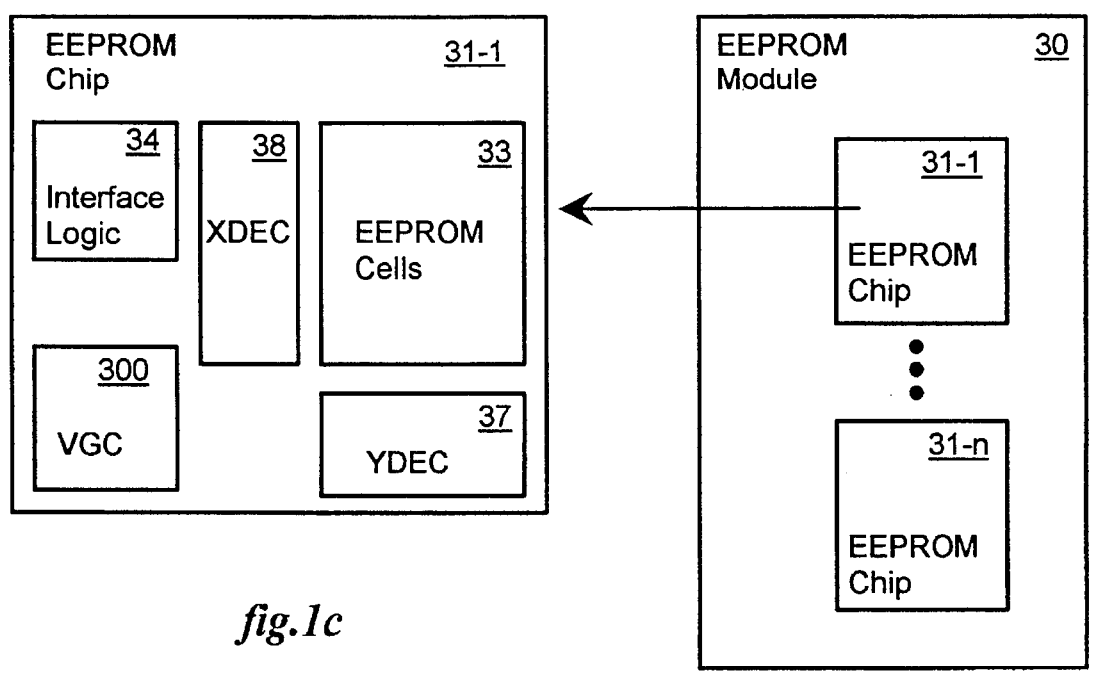
*fig.1c*
*fig.1b*

FLASH EEPROM SELF-ADAPTIVE VOLTAGE GENERATION CIRCUIT OPERATIVE WITHIN A CONTINUOUS VOLTAGE SOURCE RANGE

BACKGROUND OF THE INVENTION

This invention relates in general to voltage generation circuits and in particular, to voltage generation circuits in flash EEPROM systems which are operative within a continuous voltage source range.

In certain applications, it may be desirable for a flash EEPROM system (or flash EEPROM plug-in card) to automatically accomodate either one of two voltage sources which may be connected to the EEPROM system. For example, in a normal mode of operation, a 5 volt voltage source compatible with logic circuitry in the EEPROM system may be connected to the EEPROM system, and in a battery mode of operation, a 3 volt voltage source may be connected to the EEPROM system and automatically accomodated by connecting after its detection, the 3 volt voltage source to a voltage doubler circuit in the EEPROM system.

The operational voltage range for such conventional flash EEPROM systems are typically specified as being discontinuous. For example, the range may be specified as 3 volts±a tolerance (e.g., 5% or 10%), and 5 volts±a tolerance (e.g., 5% or 10%). Intermediate voltages are generally not specified as being within the operational range of these conventional EEPROM systems. For example, with a 5% tolerance, voltages greater than 3.15 volts and less than 4.75 volts are not specified, and with a 10% tolerance, voltages greater than 3.3 volts and less than 4.5 volts are not specified.

In certain applications, however, it may be desirable for a flash EEPROM system (or flash EEPROM plug-in card) to automatically accomodate an arbitrary source voltage within a prespecified continuous range of source voltages. In these applications, the operational voltage source range is preferably specified as a continuous range from 3 to 5 volts±tolerance (e.g., 5% or 10%).

OBJECTS AND SUMMARY OF THE INVENTION

Accordingly, one object of the present invention to provide a flash EEPROM system or plug-in card which is operative within a continuous voltage source range.

Another object of the present invention is to provide a self-adaptive voltage generation circuit which is operative within a continuous voltage source range and useful in a flash EEPROM system.

Still another object of the present invention is to provide a voltage regulated charge pump which is operative within a continuous voltage source range and useful in a flash EEPROM system.

These and additional objects are accomplished by the various aspects of the present invention, wherein one aspect is a flash EEPROM system operative within a continuous voltage source range. The flash EEPROM system includes a comparator connected to a voltage source providing an arbitrary source voltage within a prespecified voltage source range, and at least one EEPROM module connected to the comparator. The comparator generates a control signal indicative of a comparison of a reference voltage to the arbitrary source voltage provided by the voltage source. The EEPROM module includes a plurality of EEPROM cells and a voltage generation circuit responsive to the control signal to generate a plurality of voltages for programming, reading, land erasing the plurality of EEPROM cells such that the respective magnitudes of the plurality of voltages for programming, reading, and erasing the EEPROM cells are substantially same values for any received source voltage within the continuous voltage source range.

Another aspect is a self-adaptive voltage generation circuit operative within a continuous voltage source range for generating a plurality of voltages for programming, reading, and erasing a flash EEPROM. The self-adaptive voltage generation circuit includes means for receiving a source Voltage provided to the self-adaptive voltage generation circuit, and generating a control signal indicative of a subrange, including the received source voltage, within the continuous voltage source range; and means responsive to the control signal, for generating from the source voltage, the plurality of voltages for programming, reading, and erasing a flash EEPROM such I that the respective magnitudes of the plurality of voltages for programming, reading, and erasing a flash EEPROM are substantially same values for any received source voltage within the continuous voltage source range.

Another aspect is a self-adaptive voltage generation circuit operative within a continuous voltage source range for generating a plurality of voltages for programming, reading, and erasing a flash EEPROM. The self-adaptive voltage generation circuit includes a comparator circuit and a voltage generation circuit. The comparator circuit has a first input connected to an arbitrary source voltage, at least one second input respectively receiving at least one reference voltage respectively associated with a subrange range of the continuous voltage source range, and an output providing at least one control signal indicative of a comparison between the received arbitrary source voltage and the received at least one reference voltage. The voltage generation circuit is connected to the comparator circuit and has a first input connected to the arbitrary source voltage provided to the self-adaptive voltage generation circuit, at least one second input respectively connected to the at least one control signal, and a plurality of outputs respectively providing the plurality of voltages for programming, reading, and erasing a flash EEPROM such that magnitudes of the plurality of voltages are respectively substantially same values for different connected source voltages within the continuous voltage source range.

Still another aspect is a voltage regulated charge pump circuit comprising: a charge pump circuit including a plurality of energy storing elements (e.g., 3405 and 3406 in FIG. 5) connected to a power source providing an input voltage to the plurality of energy storing elements such that energy from the power source is transferred between adjacent ones of the plurality of energy storing elements so as to generate an output voltage greater than the input voltage at an output of the charge pump circuit; means responsive to a feedback control signal e.g., output of comparator 3420 in FIG. 5) and connected to at least two of the plurality of energy storing elements for stopping a transfer of energy from one to the other of the at least two energy storing elements when the feedback control signal is active; and means for generating the feedback control signal such that the feedback control signal is only active while the output voltage is greater than a reference voltage by a fixed factor.

Yet another aspect is a voltage regulated charge pump comprising: a plurality of voltage doubler circuits, wherein a 1st one of the voltage doubler circuits receives a voltage Vdd and generates, in response to a first clock signal, a first output voltage substantially equal to 2*Vdd during odd phases of the first clock signal and Vdd during even phases of the first clock signal, and a last one of the voltage doubler circuits designated as an nth one of the voltage doubler circuits receives a first (n−1)th output voltage of a second to last one of the voltage doubler circuits designated as an (n−1)th one of the voltage doubler circuits and generates, in response to the first clock signal, a first nth output voltage substantially equal to $2^n$*Vdd during the odd phases of the first clock signal and $2^{(n-1)}$*Vdd during the even phases of the first clock signal; means responsive to a feedback control signal and connected to the (n−1)th and nth ones of the voltage doubler circuits, for electrically disconnecting the (n−1)th one of the voltage doubler circuits from the nth one of the voltage doubler circuits such that the nth voltage doubler circuit does not receive the first (n−1)th output voltage of the (n−1)th one of the voltage doubler circuits while the feedback control signal is active; and means for generating the feedback control signal such that the feedback control signal is only active while the first nth output voltage is greater than a reference voltage by a fixed factor.

Still another aspect is a method of generating a plurality of voltages for programming, reading, and erasing a plurality of flash EEPROM cells, comprising the steps of: comparing a source voltage against at least one reference voltage indicative of at least one corresponding subrange within a continuous voltage range of source voltages, and generating at least one corresponding control signal in response to such comparison; adjusting the open loop gain of a regulated charge pump in response to the at least one corresponding control signal such that an output voltage of the regulated charge pump remains substantially the same for source voltages within the continuous voltage range of source voltages; and generating the plurality of voltages for programming, reading, and erasing the plurality of flash EEPROM cells from the output voltage of the regulated charge pump.

Additional objects, features and advantages of the various aspects of the present invention will become apparent from the following description of its preferred embodiment, which description should be taken in conjunction with the accompanying drawings.

BRIEF DESCRIPTION OF THE DRAWINGS

FIG. 1a illustrates, as an example, a block diagram of a computer system including a host computer and a flash EEPROM system connected to the host computer;

FIG. 1b illustrates, as an example, a block diagram of the flash EEPROM module included in the flash EEPROM system of FIG. 1a;

FIG. 1c illustrates, as an example, a block diagram of the flash EEPROM chip included in the flash EEPROM module of FIG. 1b;

FIG. 2 illustrates, as an example, a block diagram of a conventional voltage generation portion of the conventional flash EEPROM system of FIG. 1a;

FIG. 9 illustrates, as an example, a block diagram of a self-adaptive voltage generation portion, utilizing aspects of the present invention, of a flash EEPROM system useful in the computer system of FIG. 1a.

DETAILED DESCRIPTION OF THE PREFERRED EMBODIMENTS

Figure 2:
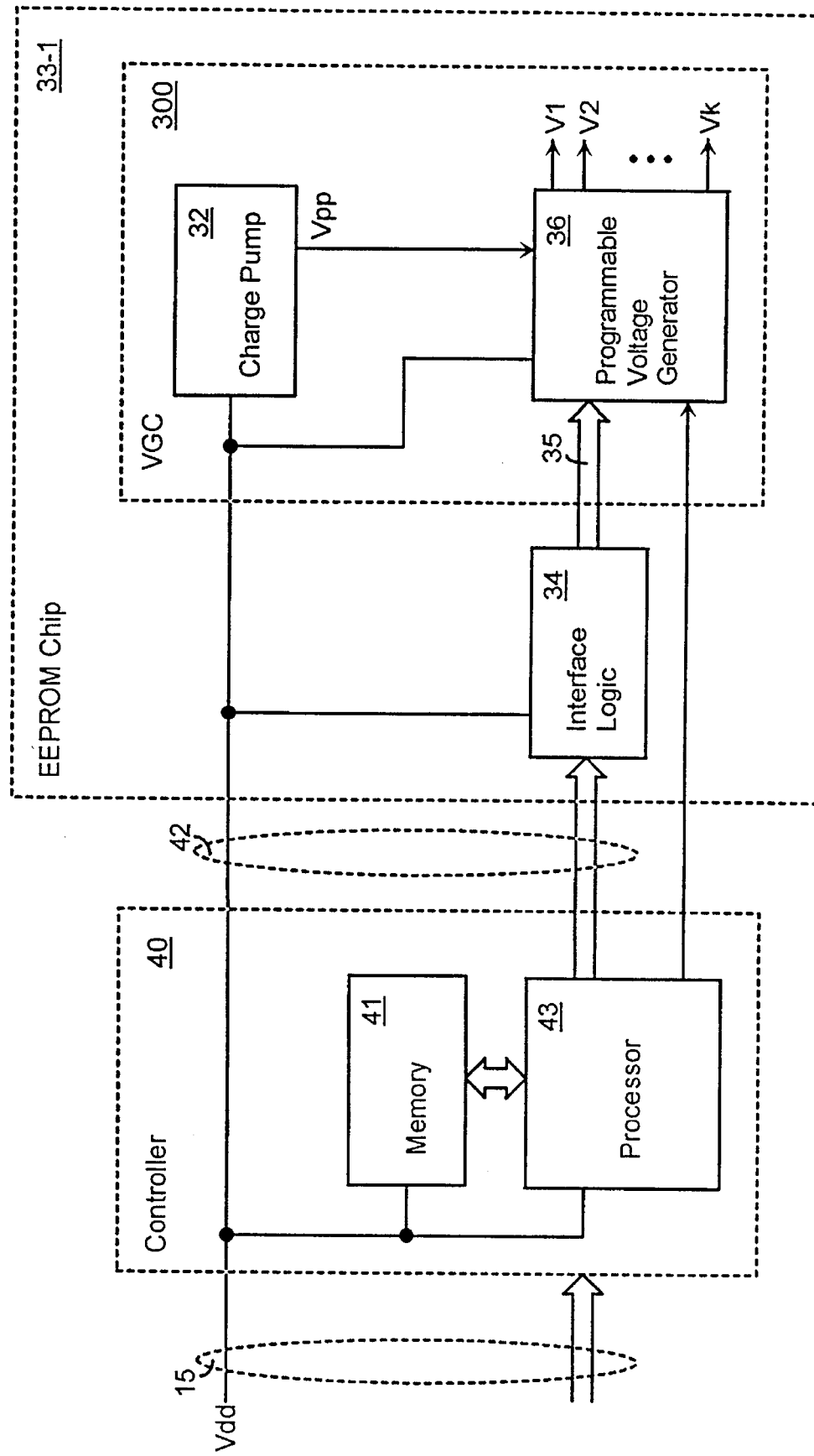

Application Ser. No. 08/325,774 now U.S. Pat. No. 5,508,971, entitled "Programmable Power Generation Circuit for Flash EEPROM Memory Systems," incorporated herein by this reference, and naming Raul-Adrian Cernea, Douglas J. Lee, Mehrdad Mofidi, and Sanjay Mehrotra as inventors, describes a flash EEPROM system functioning as a mass storage medium for a host computer. The flash EEPROM system includes a controller and at least one flash EEPROM memory module. The flash EEPROM memory module includes at least one flash EEPROM chip having an on-chip programmable power generation circuit including a high voltage generation circuit capable of generating a high voltage Vpp from a logic level voltage Vdd provided to the chip, a serial protocol logic circuit, a data latch, a data bus, a register address decoder, and a multi-voltage generation. The multi-voltage generation includes a plurality of registers and provides the programming, reading, and erasing voltages required for proper operation of the flash EEPROM system from digital values stored in the plurality of registers by the controller. The high voltage generation circuit includes both high current and low current charge pump circuits for generating the high voltage Vpp. The high current charge pump circuit is connected to relatively large off-chip charge storage devices, and the low current charge pump circuit is connected to relatively small on-chip charge storage devices. The controller may activate one or the other of the high or low current charge pump circuits through control signals connected to enabling circuitry respectively connected to the high and low current charge pump circuits. Alternatively, the controller may deactivate both the high and low current charge pump circuits and cause the high voltage Vpp to be provided from other circuitry on another flash EEPROM chip in the flash EEPROM module.

FIGS. 1a–1c illustrate, as an example, a flash EEPROM system 20 (or flash EEPROM plug-in card or module) which serves as a mass storage medium for a host computer 10 by emulating a hard disk system. In FIG. 1a, a simplified block diagram of a computer system is shown including the host computer 10, a system bus 15, and the flash EEPROM system 20 which communicates with the host computer 10 via the system bus 15. Included in the flash EEPROM system 20 are a controller 40 and a flash EEPROM module 30. The controller 40, which includes a processor 43 and a memory 41, interprets the disk drive commands received from the host computer 10, and translates them into corresponding read and write operations for the flash EEPROM module 30, in a manner transparent to the host computer 10.

In FIG. 1b, the flash EEPROM module 30 is shown to include a plurality of flash EEPROM chips, 31-1 to 31-n. In FIG. 1c, each flash EEPROM chip (e.g., 31-1) is shown to include a plurality of flash EEPROM cells 33, conventional row and column decode circuitry, XDEC and YDEC, for accessing selected ones of the flash EEPROM cells 33, certain interface logic 34, and a voltage generator circuit 300 ("VGC") for generating the voltages for programming, reading, and erasing the plurality of flash EEPROM cells 33. Although not shown, the flash EEPROM cells 33 are generally organized in a matrix array and selectively accessed by the row decoder XDEC 38 through a plurality of word lines connected the control gates of flash EEPROM cells in respective rows of the matrix array, and the column decoder YDEC 37 through a plurality of bit lines connected to the drains of flash EEPROM cells in respective columns of the matrix array.

FIG. 2 illustrates, as an example, a simplified block diagram of portions of the flash EEPROM system 20 related to the voltage generation circuit 300. The controller 40 communicates with each of the flash EEPROM chips 33-1 to 33-n of the flash EEPROM module 30 via an internal bus 42 of the flash EEPROM system 20. In each of the flash EEPROM chips 33-1 to 33-n, a DC-DC converter or charge pump circuit (e.g., 32) generates a high voltage Vpp from a lower voltage source Vdd, a programmable voltage generator (e.g., 36) generates voltages for programming, reading, and erasing the flash EEPROM cells (e.g., 33) of the flash EEPROM chip (e.g., 33-1), and interface logic (e.g., 34) programs, among other functions, certain registers in the programmable voltage generator (e.g., 36).

Figure 3:
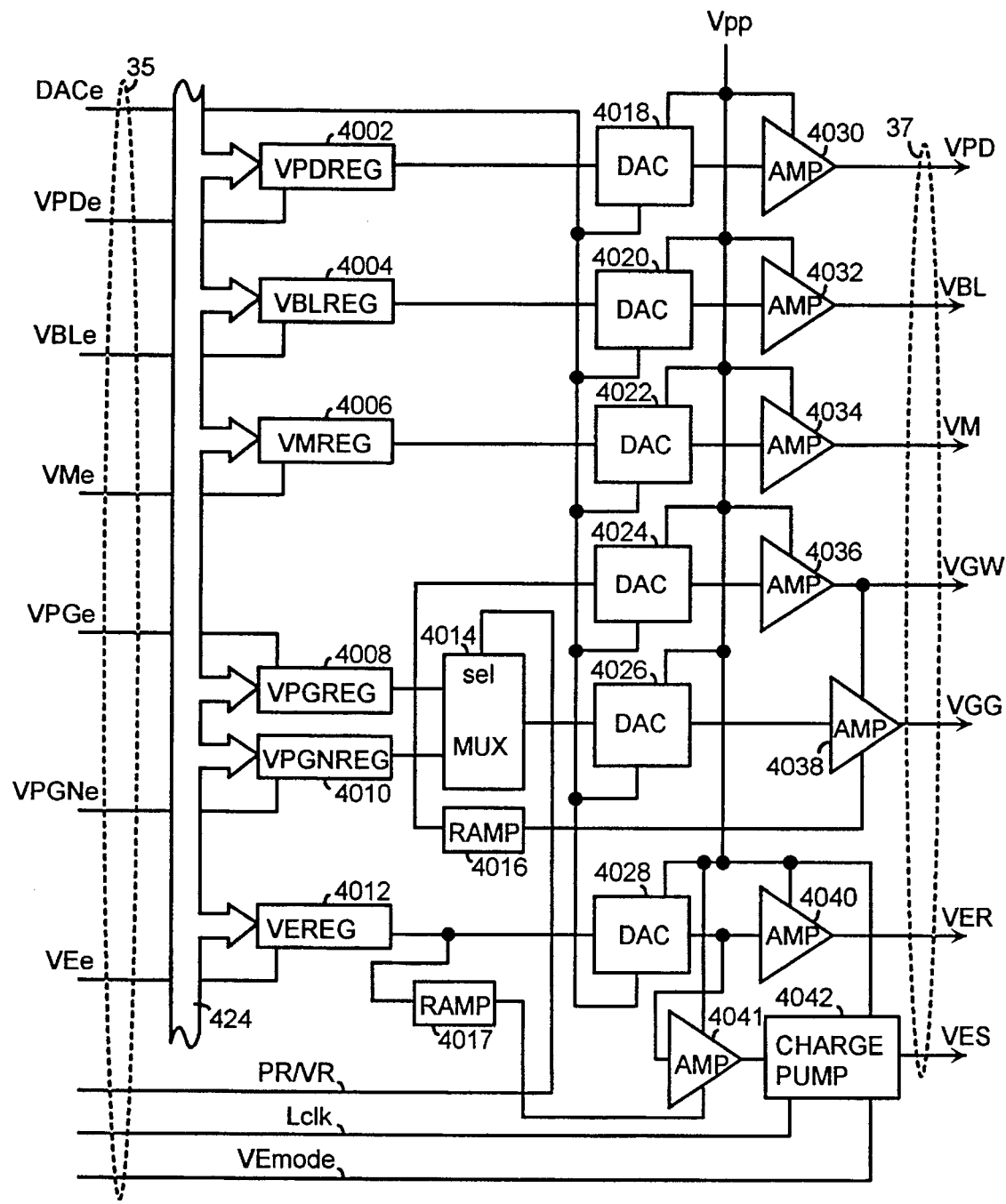
FIG. 3 illustrates, as an example, a block diagram of a conventional programmable voltage generation circuit useful in the flash EEPROM system of FIG. 2.

FIG. 3 illustrates, as an example, a block diagram of the programmable voltage generation circuit 36. The programmable voltage generation circuit 36 includes a plurality of registers 4002–4012 for storing digital values indicative of various voltages for programming, reading, and erasing one or more selected flash EEPROM cells. For example, a VPDREG register 4002 stores a digital value indicative of a general logic voltage VPD, a VBLREG register 4004 stores a digital value indicative of a bit line voltage VBL during programming mode, a VMREG register 4006 stores a digital value indicative of a voltage provided to the gate of a reference flash EEPROM cell, a VPGREG register 4008 stores a digital value indicative of a word line voltage during programming mode, a VPGNREG register 4010 stores a digital value indicative of a word line voltage during reading or verifying modes, and a VEREG register 4012 stores a digital value indicative of an erase gate voltage.

Each of the plurality of registers 4002–4012 is loaded with its stored value (i.e., programmed) by the controller 40. In particular, the controller 40 programs a selected one of the plurality of registers 4002–4012 by providing its digital value to the selected register via internal bus 42 and interface logic 34. The controller 40 also provides certain control signals to the programmable voltage generation circuit 36 via internal bus 42.

Also included in the programmable voltage generation circuit 36 are a plurality of digital-to-analog converters ("DACs") 4018–4028 which convert the digital information stored in the plurality of registers 4002–4012 into corresponding analog voltages, and a plurality of feedback amplifiers ("AMPs") 4030–4041 conventionally constructed to buffer, amplify, and regulate the analog voltages provided by the plurality of DACs 4018–4028 to provide voltages useful in programming, reading, and erasing selected flash EEPROM cells. Except for AMP 4038, the high voltage Vpp is provided to each of the DACs 4018–4028 and AMPs 4030–4041 by the high voltage generation circuit 32. AMP 4038 receives its supply voltage from the output of AMP 4036 to ensure that the word line voltage applied to the control gates of the selected flash EEPROM cells is always less than or equal to a bias voltage applied to an n-well containing the row decoder XDEC circuitry (FIG. 1c) generating the word line voltages.

To simplify the description, a single enable line DACe is shown connected to each of the DACs 4018–4028 to simultaneously activate the DACs 4018–4028. It is to be appreciated, however, that each of the DACs 4018–4028 may be enabled separately or by groups to conserve power when the voltages that they provide are not being used. As examples, if the controller 40 is programming selected flash EEPROM cells, then only those DACs providing programming related voltages need be activated; if the controller 40 is reading selected flash EEPROM cells, then only those DACs providing reading related voltages need be activated; and if the controller 40 is erasing selected flash EEPROM cells, then only those DACs providing erasing related voltages need be activated.

Also included in the programmable voltage generation circuit 36 are a multiplexer circuit ("MUX") 4014, which in response to a control signal PR/VR from the controller 40, passes either the digital value stored in the VPGREG register 368 or the VPGNREG register 4010 to DAC 4026, a ramp circuit 4016 which controls the slew rate of feedback amplifier 4038 in response to two extra bits stored in the VPGREG 368, a ramp circuit 4017 which controls the slew rate of feedback amplifier 4041 in response to two extra bits stored in the VEREG 4012, and a low current charge pump circuit 4042 including enabling circuitry responsive to a control signal Vemode from the controller 40. The MUX 4014 saves one DAC/AMP pair by selectively providing to the word line connected to one or more selected flash EEPROM cells either a programming voltage (e.g., 11 volts) corresponding to the digital value stored in the VPGREG register 368 or a reading voltage (e.g., 5 volts) corresponding to the digital value stored in the VPGNREG 4010. A significant advantage of storing the programming and reading voltages for the word line in separate registers rather then having them share one register, is that this arrangement significantly speeds up the programming process by eliminating the loading and reloading delays caused by swapping them in and out of the single register when programming the selected EEPROM cells by a series of program/verify pulses. The charge pump circuit 4042 generates the erase mode, erase gate voltage (e.g., 20 volts) from the read mode, erase gate voltage (e.g., 2 volts). Since the charge pump circuit 4042 does not have to provide high current, it can be constructed such as the low current charge pump circuitry 3800 of the high voltage generation circuit 300.

In practice, the programmable voltage generation circuit 36 facilitates provision of the optimal values for programming, reading, and erasing selected flash EEPROM cells throughout the operational life of a flash EEPROM chip containing such circuitry. For example, the values stored in the plurality of registers 4002–4012 may initially correspond to optimal values for programming, reading, and erasing flash EEPROM cells manufactured by a particular manufacturer, and may be continually updated by the controller 40 during the operational life of the flash EEPROM cells to reflect changes in the optimal values for programming, reading, and erasing the flash EEPROM cells. In particular, the values stored in the plurality of registers 4002–4012 may be updated for different selected flash EEPROM cells within the same flash EEPROM chip based upon information stored in headers associated with the different selected flash EEPROM cells.

Figure 4A:
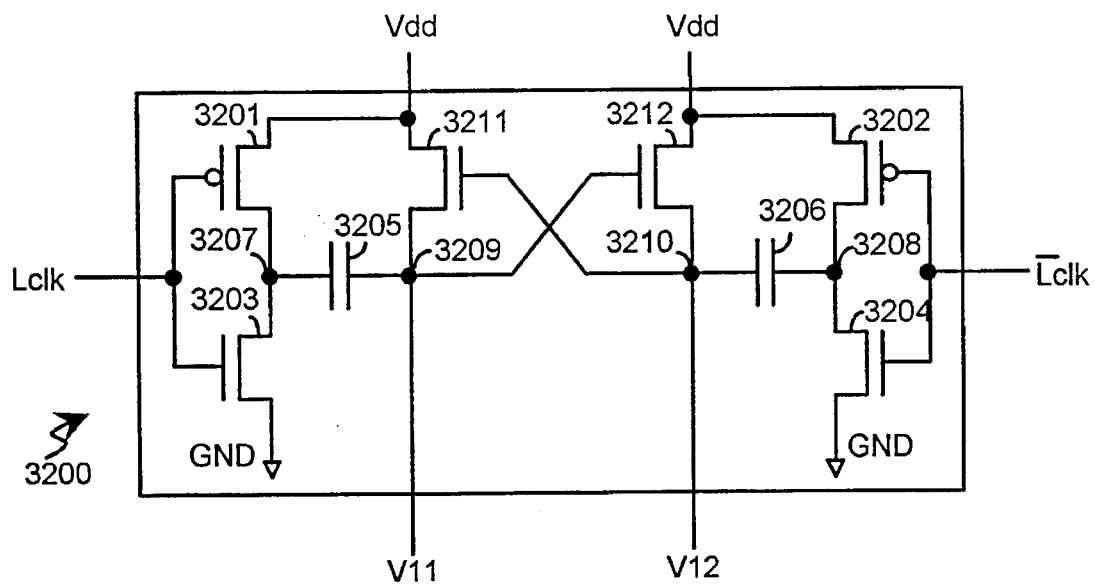
FIGS. 4a–4c respectively illustrate, as examples, circuit schematics of three connectable stages of a conventional charge pump circuit useful in the flash EEPROM system of FIG. 2.
Figure 4B:
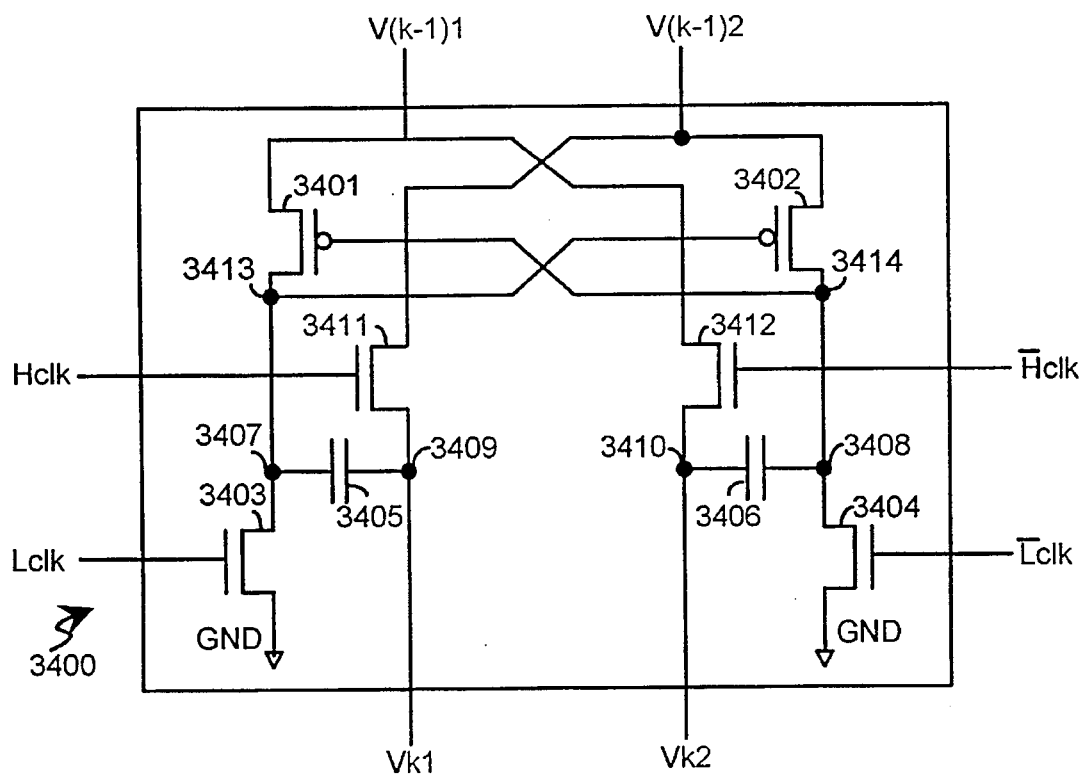
Figure 4C:
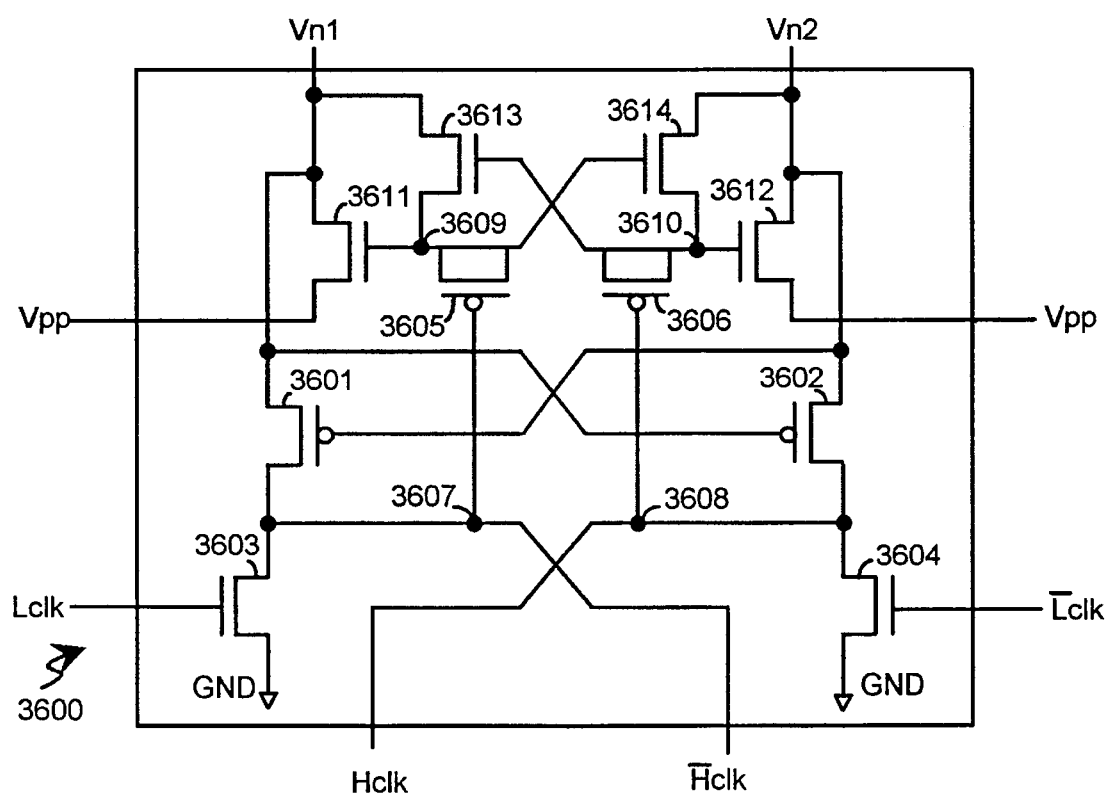
Figure 4D:
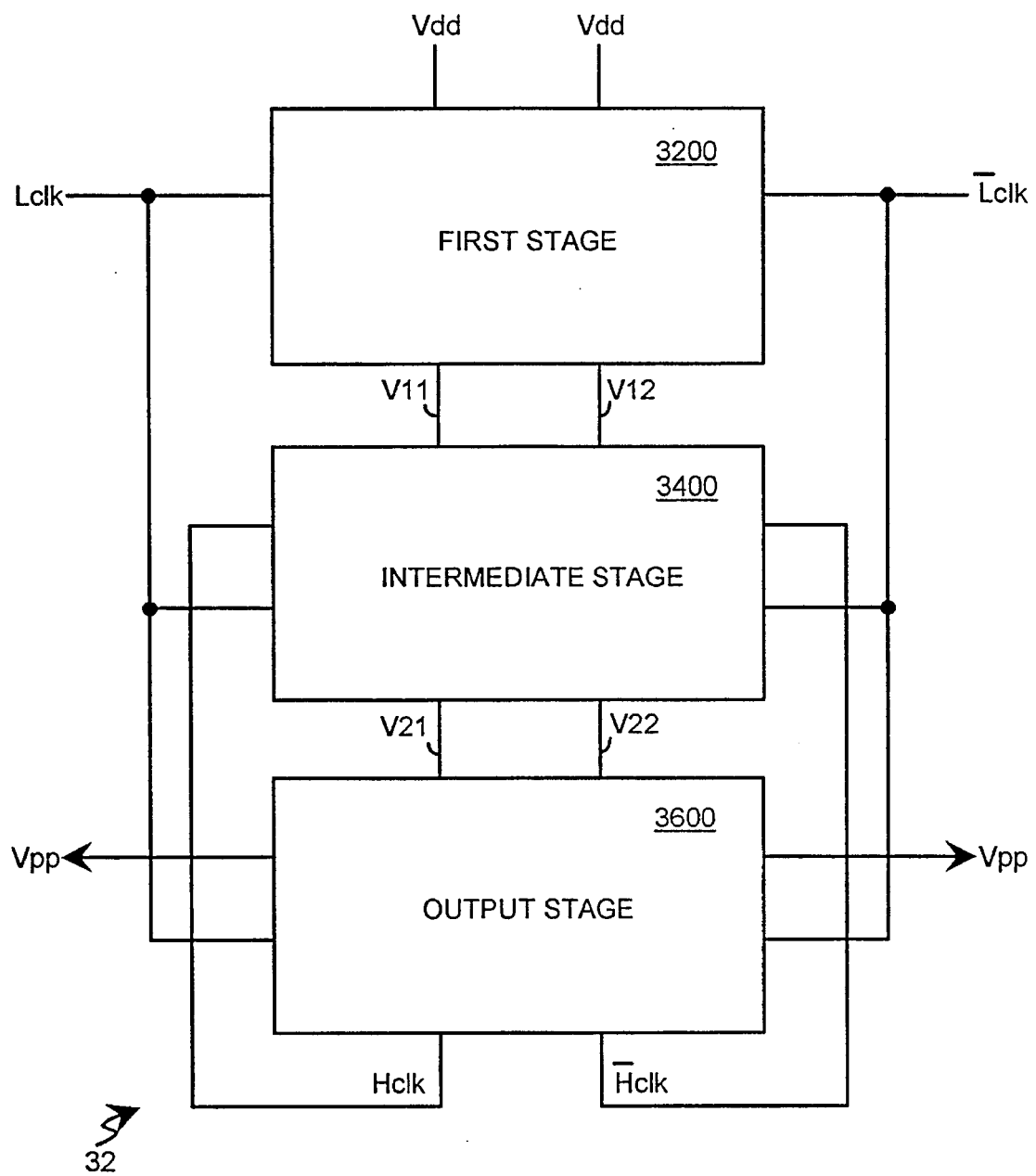
FIG. 4d illustrates, as an example, a block diagram of a conventional charge pump circuit employing the three connectable stages of FIGS. 4a–4c.

FIGS. 4a–4c respectively illustrate, as examples, circuit schematics for an input stage, one of one or more intermediate stages, and an output stage of a conventional charge pump circuit. FIG. 4d illustrates, as an example, a charge pump circuit 32 connecting the first, one intermediate, and the output stage together such that the first stage 3200 receives a source voltage Vdd and generates output voltages cycling between 2*Vdd and Vdd, the one intermediate stage 3400 receives the generated output voltages from the first stage 3200 and generates output voltages cycling between 4*Vdd and 2*Vdd, and the output stage 3600 receives the generated output voltages from the one intermediate stage 3400 and generates a high voltage output Vpp which is substantially a constant value of 4*Vdd. For the generation of higher voltage outputs, additional intermediate stages may be inserted between the first and output stages, 3200 and 3600. For additional details on such a charge pump circuit, see, e.g., U.S. Pat. No. 5,436,587 entitled "Charge Pump Circuit with Exponential Multiplication," issued to Raul-Adrian Cernea, which is incorporated herein by this reference.

Referring to FIG. 4a, a first voltage doubler stage 3200 is connected to first and second capacitors, 3205 and 3206, respectively, which charge up and supply power on alternating phases of an input clock signal Lclk to a second voltage doubler stage 3400 (FIG. 4b). In particular, on a first phase of the input clock signal Lclk the first capacitor 3205 is providing a first output voltage V11 and first output current I11 to a first input of the second stage of the charge pump circuit 32, while the second capacitor 3206 is charging up, and on a second phase of the input clock signal Lclk the second capacitor 3206 is providing a second output voltage V12 and a second output current I12 to a second input of the second stage 3400 of the charge pump circuit 32, while the first capacitor 3205 is charging up. The first voltage doubler stage 3200 includes p-mos FETs 3201 and 3202 and n-mos FETs 3203, 3204, 3211, and 3212, which connect to the first capacitor 3205 at node connections 3207 and 3209, and connect to the second capacitor 3206 at node connections 3208 and 3210.

In FIG. 4b, a second or intermediate voltage doubler stage 3400 of the charge pump circuit 32 is connected to third and fourth capacitors, 3405 and 3406, respectively, which charge up and supply power on alternating phases of the input clock signal Lclk to an output stage 3600 (FIG. 4c) of the charge pump circuit 32. In particular, on a first phase of the input clock signal Lclk the third capacitor 3405 is providing a first output voltage V21 and first output current I21 to a first input of the output stage 3600 of the charge pump circuit 32, while the fourth capacitor 3406 is charging up, and on a second phase of the input clock signal Lclk the fourth capacitor 3206 is providing a second output voltage V22 and a second output current I22 to a second input of the output stage 3600 of the charge pump circuit 32, while the third capacitor 3405 is charging up. The second voltage doubler stage 3400 includes p-mos FETs 3401 and 3402 and n-mos FETs 3403, 3404, 3411, and 3412, which connect to the third capacitor 3405 at node connections 3407 and 3409, and connect to the fourth capacitor 3406 at node connections 3408 and 3410.

In FIG. 4c, an output stage 3600 of the charge pump circuit 32 receives the first and second output voltages, V21 and V22, and first and second output currents, I21 and I22, from the second voltage doubler stage 3400 and generates therefrom, the high voltage and high current, Vpp and Ipp, respectively, wherein on the first phase of the input clock signal Lclk, the high voltage and high current, Vpp and Ipp, are supplied by the first output voltage and current, V21 and I21, and on the second phase of the input clock signal Lclk, the programming voltage and current, Vpp and Ipp, are supplied by the second output voltage and current, V22 and I22. In addition to generating the high voltage and high current, Vpp and Ipp, the output stage 3600 also generates a high voltage clock signal Hclk which it feeds back to the second voltage doubler stage 3400 (FIG. 4b). The output stage 3600 includes p-mos FETs 3601 and 3602, p-mos FET capacitors 3605 and 3606, and n-mos FETs 3603, 3604, 3611, 3612, 3613, and 3614.

For proper programming, reading, and erasing of the EEPROM cells in an EEPROM chip, the plurality of voltages, V1–Vk, generated by the EEPROM chip's voltage generation circuit 300 should not be affected by the voltage level of the source voltage Vdd being provided to the EEPROM chip. For example, if the word line voltage VGG is to be 11 volts, the bit line voltage VBL is to be 8 volts, and the erase gate voltage VER is to be 2 volts to program a selected EEPROM cell, then these voltages should be the same voltages regardless of whether the source voltage Vdd being provided to the EEPROM chip is 3 volts, 5 volts, or any voltage in-between.

There are two problems with the conventional voltage generation circuit 300 that prevent the plurality of voltages, V1–Vk, generated by the EEPROM chip's voltage generation circuit 300 from not being affected by the voltage level of the source voltage Vdd being provided to the EEPROM chip. The first problem has to do with the charge pump circuit 32, and the second problem has to do with the programmable voltage generation circuit 36. The problem with the charge pump circuit 32 is that when the source voltage Vdd changes, the output voltage Vpp of the charge pump 32 changes accordingly. For example, if the source voltage Vdd is 3 volts, then the output voltage of the charge pump circuit 32 would be approximately 4*Vdd or 12 volts. On the other hand, if the source voltage Vdd is 5 volts, then the output voltage of the charge pump circuit 32 would again be approximately 4*Vdd or 20 volts. For source voltages Vdd which are between 3 to 5 volts, the charge pump circuit 32 generates output voltages Vpp which are between 12 to 20 volts. Since the output voltage Vpp of the charge pump 32 is provided to the DACs 4018–4028, the AMPs 4030–4040, and the erase voltage charge pump 4042 of the programmable voltage generator 36, fluctuations in the output voltage Vpp directly affect the full-scale ranges of these devices and consequently, the plurality of voltages, V1–Vk, generated by the programmable voltage generator 36. On the other hand, the problem with the programmable voltage generator 36 is that when the source voltage Vdd changes, the DACs 4018–4028 of the programmable voltage generator 36 may exhibit "droop" characteristics resulting in conversion errors, which in turn, may result in further errors in the plurality of voltages, V1–Vk, generated by the programmable voltage generator 36.

Figure 5:
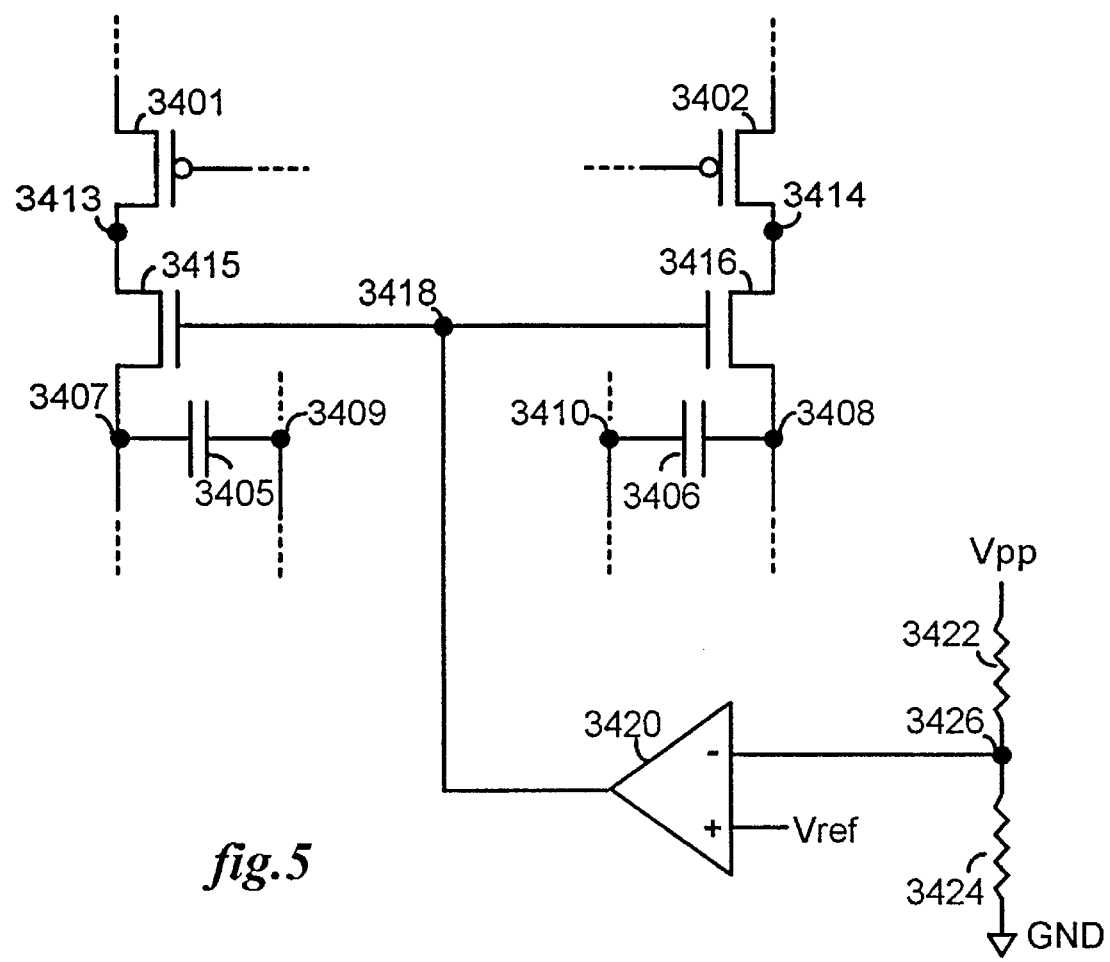
FIG. 5 illustrates, as an example, a simplified circuit schematic of a voltage regulation circuit utilizing aspects of the present invention for regulating the high voltage output of the charge pump circuit of FIGS. 4a–4c.

FIG. 5 illustrates, as an example, a circuit schematic of a voltage regulation circuit for regulating the high voltage output Vpp, and portions of the intermediate stage of the charge pump circuit 32 to which the voltage regulation circuit is connected. The voltage regulation circuit includes a voltage divider circuit comprising resistors 3422 and 3424 connected together at a node 3426, a voltage comparator or operational amplifier circuit 3420, and n-mos FETs 3415 and 3416.

The voltage divider circuit is connected to the high voltage output Vpp at one end, and the ground reference voltage GND at the other end. The voltage comparator circuit 3420 has a first (or negative) input which is connected to the node 3426 of the voltage divider circuit, a second (or positive) input which is connected to a reference voltage Vref, and an output which is in a HIGH logic state when the voltage on the node 3426 is less than or equal to the reference voltage Vref, and in a LOW logic state when the voltage on the node 3426 is greater than the reference voltage Vref.

The reference voltage Vref is generated by conventional means such as a bandgap reference voltage circuit (not shown) so that the value of the reference voltage Vref is substantially independent of voltage source Vdd changes, as well as other changes, such as changes in temperature, which may affect the circuitry of the EEPROM system including the voltage regulation circuit. The ratio of the resistances of the resistors 3422 and 3424 of the voltage divider circuit are selected such that the voltage picked off at the node 3426 is approximately the same as the reference voltage Vref. For example, if the high voltage output is to be 12 and the reference voltage is 1 volts, then the resistance of resistor 3422 is selected to be eleven times larger than that of resistor 3424.

The n-mos FETs 3415 and 3416 are added to the intermediate stage 3400 of the charge pump circuit 32 to form a modified charge pump circuit 32'. The n-mos FET 3415 has a drain connected at node 3413 to the drain of the p-mos FET 3401 of the intermediate stage 3400, and a source connected at node 3407 to the capacitor 3405 of the intermediate stage 3400. In a similar fashion, the n-mos FET 3416 has a drain connected at node 3414 to the drain of the p-mos FET 3402 of the intermediate stage 3400, and a source connected at node 3408 to the capacitor 3406 of the intermediate stage 3400. The gates of the n-mos FETs 3415 and 3416 are connected together and to the output of the comparator 3420 at node 3418.

Accordingly, as long as the voltage at node 3426 of the voltage divider circuit is less than or equal to the reference voltage Vref, both n-mos FETs 3415 and 3416 are turned on so that current passing through them charge up their respective capacitors, 3405 35 and 3406. When the voltage at node 3426 of the voltage divider circuit becomes greater than the reference voltage Vref, however, both n-mos FETs 3415 and 3416 are turned off so that current no longer passes through them to charge up their respective capacitors, 3405 and 3406. Stated in another way, as long as the high voltage output Vpp of the charge pump circuit 32' is less than or equal to the reference voltage Vref by a factor determined by the ratio of the resistances of the resistors 3422 and 3424, both n-mos FETs 3415 and 3416 are turned on allowing energy to be transferred from the first stage 3200 of the charge pump 32' to their respective capacitors, 3405 and 3406; and while the high voltage output Vpp of the charge pump circuit 32' is greater than the reference voltage Vref by such factor, both n-mos FETs 3415 and 3416 are turned off, thus stopping the transfer of energy from the first stage 3200 of the charge pump 32' to their respective capacitors, 3405 and 3406.

Figure 6:
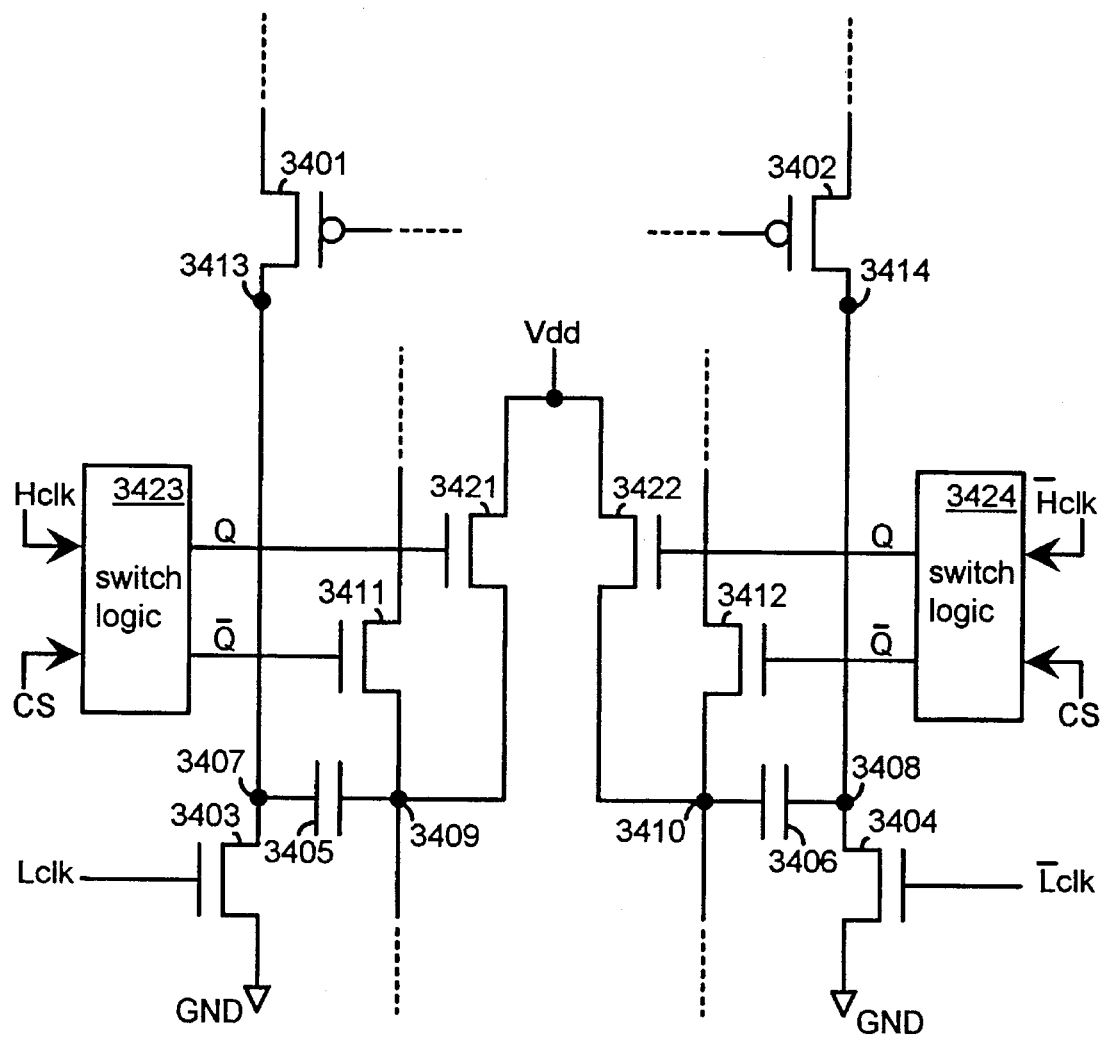
FIG. 6 illustrates, as an example, a simplified circuit schematic of a voltage adjustment circuit utilizing aspects of the present invention for effectively adjusting the open loop gain of the voltage regulation circuit of FIG. 5.

In regulating the high voltage output Vpp, it may be desirable to change the open loop gain (i.e., DC—DC conversion factor or gain) of the charge pump circuit 32' with changes in the source voltage Vdd. For example, a DC-DC conversion gain of 4 is efficient with a source voltage of 3 volts for regulating the high voltage output Vpp to 12 volts, since the open loop high voltage output of 12 volts is the same as the desired closed loop high voltage output of 12 volts, whereas, a DC-DC conversion gain of 4 is inefficient with a source voltage of 5 volts for regulating the high voltage output Vpp to 12 volts, since the open loop high voltage output of 20 volts is much larger than the desired closed loop high voltage output of 12 volts, whereas, a FIG. 6 illustrates, as an example, a circuit schematic of a voltage adjustment circuit for adjusting the open loop gain of the modified charge pump circuit 32', and portions of the intermediate stage of the charge pump circuit 32' to which the voltage adjustment circuit is connected. The voltage adjustment circuit includes two n-mos FETs, 3421 and 3422, and two switch logic circuits, 3423 and 3424.

The n-mos FET 3421 has a drain connected to the source voltage Vdd, and a source connected at node 3409 to the source of the n-mos FET 3411 and the capacitor 3405 of the intermediate stage of the charge pump circuit 32'. Similarly, the n-mos FET 3422 has a drain also connected to the source voltage Vdd, and a source connected at node 3410 to the source of the n-mos FET 3412 and the capacitor 3406 of the intermediate stage of the charge pump circuit 32'.

The switch logic circuits, 3423 and 3424, effectively function as multiplexers in response to a common control signal CS. In particular, when the control signal CS is in a first state indicative of a 3 volt source voltage Vdd being provided to the EEPROM chip including the charge pump 32', the switch logic circuits, 3423 and 3424, respectively pass the high voltage clock signal Hclk and inverted high voltage clock signal Hclk-bar to the n-mos FETs, 3411 and 3412, of the intermediate stage of the charge pump circuit 32'; and when the control signal CS is in a second state indicative of a 5 volt source voltage Vdd being provided to the EEPROM chip including the charge pump 32', the switch logic circuits, 3423 and 3424, respectively pass the high voltage clock signal Hclk and inverted high voltage clock signal Hclk-bar to the n-mos FETs, 3421 and 3422, of the voltage adjustment circuit.

Accordingly, when the control signal CS is in the first state indicative of a 3 volt source voltage Vdd being provided to the EEPROM chip including the charge pump 32', the DC—DC conversion gain of the charge pump 32' is 4 (i.e., Vpp÷Vdd), since the inputs, V11 and V12, to the intermediate stage are 2*Vdd and the potential of the capacitors, 3405 and 3406, of the intermediate stage are also charged up to 2*Vdd on power providing cycles of the charge pump circuit 32'. On the other hand, when the control signal CS is in the second state indicative of a 5 volt source voltage Vdd being provided to the EEPROM chip including the charge pump 32', the DC-DC conversion gain of the charge pump 32' is only 3; since, even though the inputs, V1 and V12, to the intermediate stage are 2*Vdd, the potential of the capacitors, 3405 and 3406, of the intermediate stage are only charged up to Vdd in this case on power providing cycles of the charge pump circuit 32'.

Figure 7A:
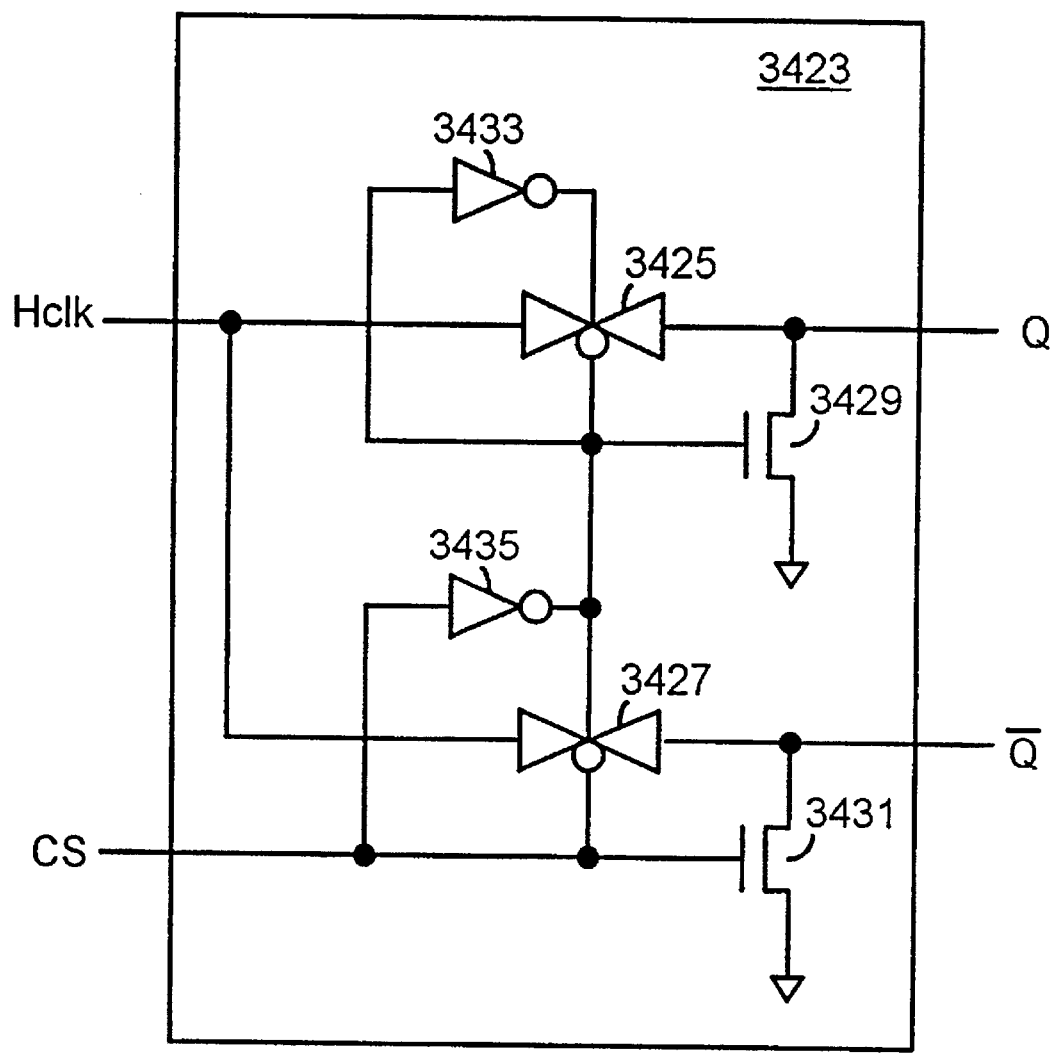
FIGS. 7a and 7b illustrate, as examples, circuit schematics for switching logic included in the voltage adjustment circuit of FIG. 6.
Figure 7B:
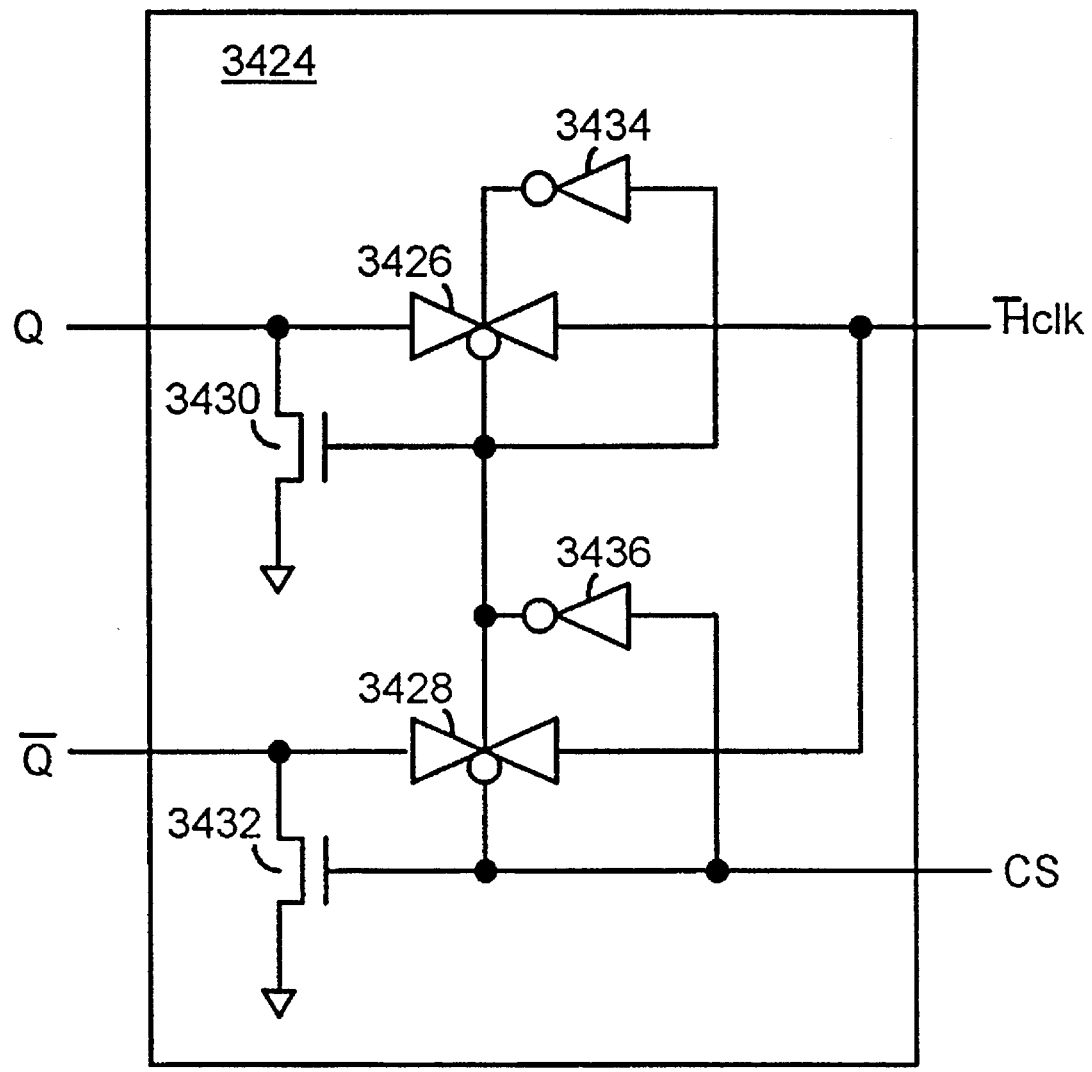

FIGS. 7a and 7b respectively illustrate, as examples, circuit schematics for the switching logic, 3423 and 3424, included in the voltage adjustment circuit of FIG. 6. As shown in FIG. 7a, the switching logic 3423 includes two transfer gates, 3425 and 3427, two inverters, 3433 and 3435, and two n-mos FETs, 3429 and 3431. When the control signal CS is in a HIGH logic state, the n-mos FET 3429 is turned off and the transfer gate 3425 turned on, passing the high voltage clock signal Hclk to a Q-output of the switching logic 3423; and the transfer gate 3427 is turned off and the n-mos FET 3431 is turned on, pulling a Q-bar-output of the switching logic 3423 down to a ground reference voltage GND. On the other hand, when the control signal CS is in a LOW logic state, the transfer gate 3425 is turned off and the n-mos FET 3429 is turned on, pulling the Q-output of the switching logic 3423 down to the ground reference voltage GND; the n-mos FET 3431 is turned off and the transfer gate 3427 turned on, passing the high voltage clock signal Hclk to the Q-bar-output of the 35 switching logic 3423. As shown in FIG. 7b, the switching logic 3424 also includes two transfer gates, 3426 and 3428, two inverters, 3434 and 3436, and two n-mos FETs, 3430 and 3432, which operate in a similar fashion as their respective counterparts in FIG. 7a.

Even though the regulated charge pump as described in reference to FIGS. 4a–d, 5, 6, and 7a–b, may maintain a substantially constant high voltage output Vpp regardless of the value of the source voltage Vdd, the programmable voltage generator 36 may still generate slightly inaccurate voltages for programming, reading, and erasing the EEPROM cells of its EEPROM chip, because the DACs 4018–4028 of the programmable voltage generator 36 may exhibit "droop" characteristics resulting in conversion errors, which in turn, result in errors between the programmed values for the plurality of voltages, V1–Vk, and their generated values by the programmable voltage generator 36.

Figure 8A:
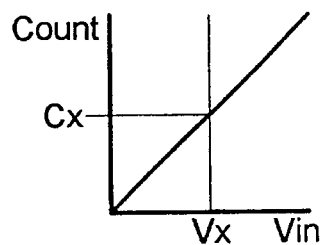
FIGS. 8a–8e respectively illustrate, as examples, a voltage source changing over time, and a flow diagram of a method for maintaining as substantially constant, a plurality of voltages for programming, reading, and erasing EEPROM cells as the voltage source changes over time.
Figure 8B:
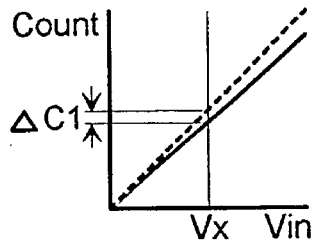
Figure 8C:
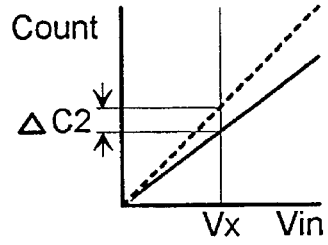
Figure 8D:
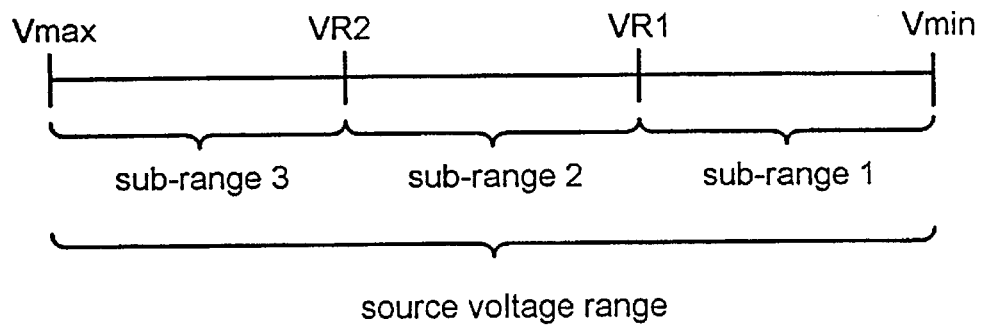

FIGS. 8a–8c respectively illustrate simplified examples of the characteristics of a representative one of the DACs, 4018–4028, for three different voltage sub-ranges within a source voltage range, as depicted in FIG. 8d. In FIG. 8a, the source voltage Vdd provided to the representative DAC is within sub-range 3 (i.e., $VR2 < Vdd \leq Vmax$), in FIG. 8b, the source voltage Vdd provided to the representative DAC is within sub-range 2 (i.e., $VR1 < Vdd \leq VR2$), and in FIG. 8c, the source voltage Vdd provided to the representative DAC is within sub-range 1 (i.e., $Vmin \leq Vdd \leq VR1$). As depicted in the figures, as the source voltage Vdd gets smaller (i.e., going from Vmax down to Vmin), a conversion error for the representative DAC gets larger. For examples, as shown in FIG. 8a, when the source voltage Vdd is within sub-range 3, the conversion error is essentially zero, as shown in FIG. 8b, when the source voltage Vdd is within sub-range 2, the conversion error is $\Delta C1$, and as shown in FIG. 8c, when the source voltage Vdd is within sub-range 1, the conversion error is $\Delta C2$, where $\Delta C2 > \Delta C1$.

Figure 8E:
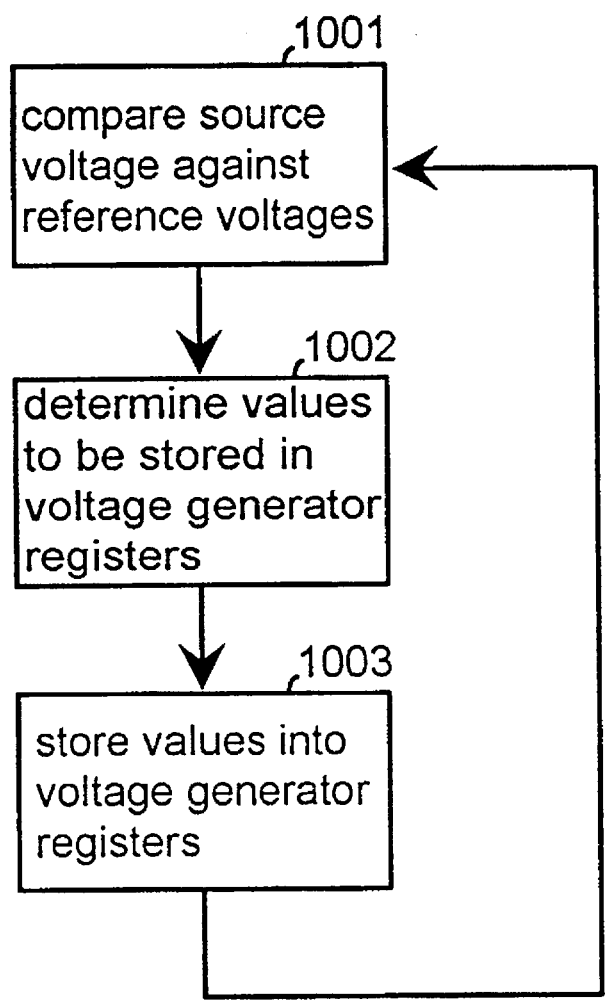

FIG. 8e illustrates, as an example, a flow chart describing a method for automatically compensating for such conversion errors as described in reference to FIGS. 8a–8c. In a step 1001, a comparator (e.g., 500 in FIG. 9) compares the source voltage Vdd provided to the EEPROM system against one or more reference voltages (cumulatively represented, for example, as VR in FIG. 9), and generates one or more corresponding control signals (cumulatively represented, for example, as CS in FIG. 9) in response thereof. As an example, the reference voltages may be Vmin, VR1, VR2, and Vmax as depicted in FIG. 8d, and the comparator (e.g., 500 in FIG. 9) may generate three control signals, CS1–CS3, such that only CS1 is active if the source voltage Vdd is within sub-range 1 (e.g., $Vmin \leq Vdd \leq VR1$), only CS2 is active if the source voltage Vdd is within sub-range 2 (e.g., $VR1 < Vdd \leq VR2$), and only CS3 is active if the source voltage Vdd is within sub-range 3 (e.g., $VR2 < Vdd \leq Vmax$). As another example, the reference voltage may be simply a value VRx which is half-way between Vmin and Vmax, and the comparator (e.g., 500 in FIG. 9) may generate only one control signal CSx such that CSx is active if the source voltage Vdd is between Vmin and VRx (i.e., $Vmin \leq Vdd \leq VRx$), and CSx is inactive if the source voltage Vdd is between VRx and Vmax (i.e., $VRx < Vdd \leq Vmax$).

In step 1002, the one or more control signals (cumulatively represented, for example, as CS in FIG. 9) are provided, for example, to a processor (e.g., 43' in FIG. 9) which determines the appropriate values indicative of various voltages for programming, reading, and erasing one or more selected flash EEPROM cells in the EEPROM system, which are to be stored or programmed into the plurality of registers, 4002–4012, of the programmable voltage generator circuit 36. For example, if the comparator (e.g., 500 in FIG. 9) generates the single control signal CSx as described in the previous example, and the control signal CSx is inactive (i.e., $VRx < Vdd \leq Vdd$), then the processor (e.g., 43' in FIG. 9) may merely look up the appropriate values to be stored or programmed into the plurality of registers, 4002–4012, from corresponding registers in a memory (e.g., 41'). On the other hand, if the control signal is active (i.e., $Vmin \leq Vdd \leq VRx$), then the processor (e.g., 43' in FIG. 9) may again look up the values to be stored or programmed into the plurality of registers, 4002–4012, from the corresponding registers in the memory (e.g., 41'), but add correction factors (e.g., one or more counts) to these values, as appropriate, before storing or programming the corrected values into the plurality of registers, 4002–4012.

In step 1003, the processor (e.g., 43' in FIG. 9) then stores or programs the register values determined in step 1002, into corresponding registers of the plurality of registers, 4002–4012. Meanwhile, the comparator (e.g., 500 in FIG. 9) may continue to compare the source voltage Vdd against the one or more reference voltages (cumulatively represented, for example, as VR in FIG. 9) so that in the case that the source voltage Vdd changes significantly, its generated one or more control signals (cumulatively represented, for example, as CS in FIG. 9) may change accordingly, and steps 1002 and 1003 repeated to update the contents of the plurality of registers, 4002–4012, accordingly. Alternatively, the comparator (e.g., 500 in FIG. 9) may only periodically compare the source voltage Vdd against the one or more reference voltages (cumulatively represented, for example, as VR in FIG. 9) to conserve energy.

Figure 9:
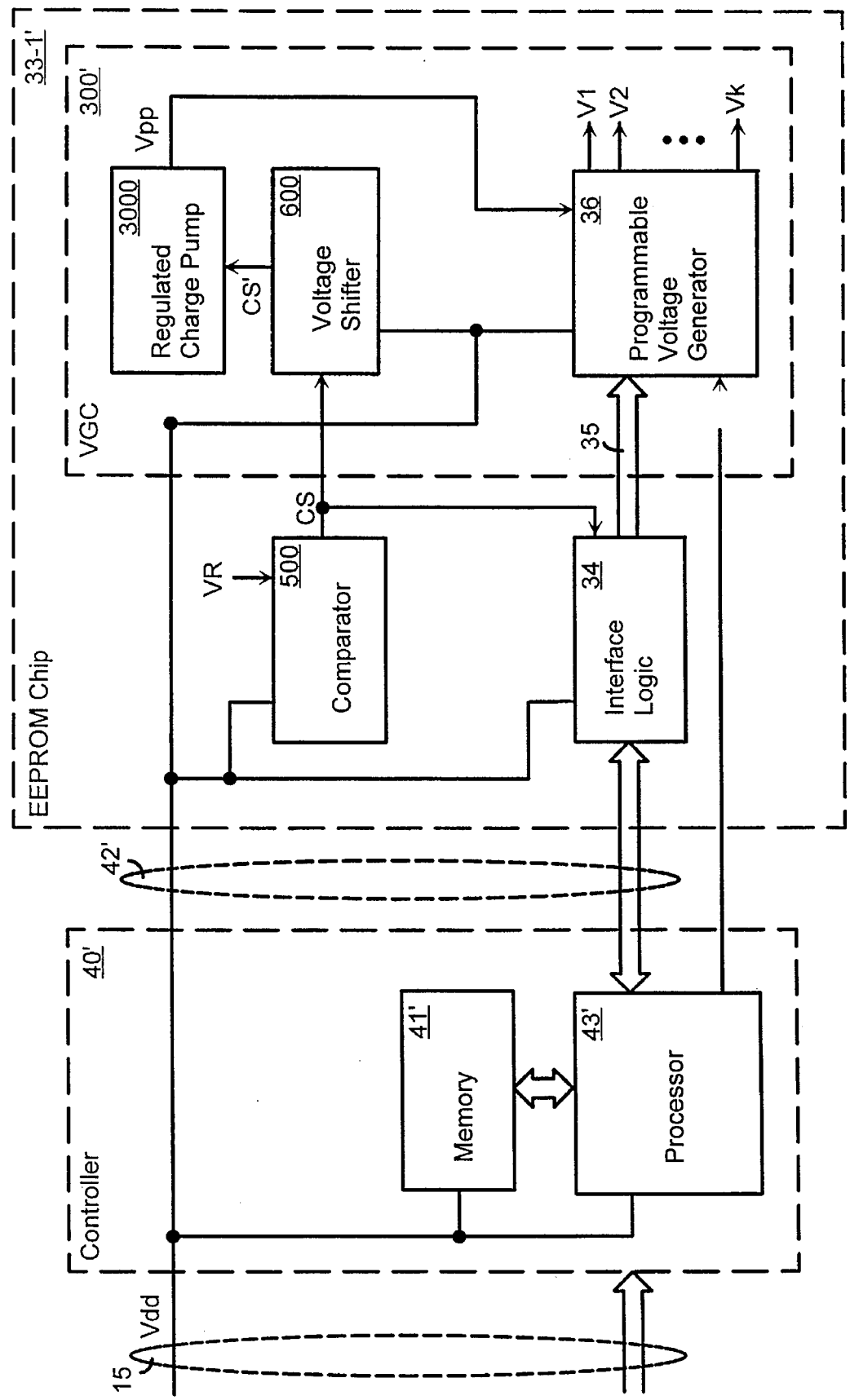

FIG. 9 illustrates, as an example, a block diagram of a self-adaptive voltage generation portion, utilizing aspects of the present invention, of a flash EEPROM system useful in the computer system of FIG. 1a. In particular, a flash EEPROM chip (e.g., 33-1') includes a comparator 500 for comparing the source voltage Vdd provided to the flash EEPROM system against one or more reference voltages (cumulatively represented, for example, as VR) to generate one or more control signals (cumulatively represented, for example, as CS) as described in reference to FIGS. 8a–8d, and a self-adaptive voltage generation circuit 300' which generates a plurality of voltages, V1–Vk, for programming, reading, and erasing one or more selected flash EEPROM cells in the flash EEPROM chip (e.g., 33-1'). The comparator 500 provides the one or more control signals CS back to a processor 43' of a controller 40' connected to the EEPROM chip (e.g., 33-1'), upon request by the processor 43', for example, through interface logic 34. The self-adaptive voltage generation circuit 300' includes a programmable voltage generation circuit 36 as described in reference to FIG. 3, a voltage shifter 600, and a regulated charge pump circuit 3000. The voltage shifter 600 shifts the typically logic level voltages of the one or more control signals (cumulatively represented, for example, as CS) received from the comparator 600 into appropriate voltage levels, for example, to turn on and off the transfer gates 3425 and 3434 in FIGS. 7a and 7b. The regulated charge pump circuit 3000 preferably includes the charge pump circuit 32 of FIGS. 4a–4d, the voltage regulation circuit of FIG. 5, and the voltage adjustment circuit of FIG. 6, as described in reference to those figures.

Although the various aspects of the present invention have been described with respect to a preferred embodiment, it will be understood that the invention is entitled to full protection within the full scope of the appended claims.

What is claimed is:

1. A flash EEPROM system connected to a voltage source providing an arbitrary source voltage within a prespecified voltage range, comprising:

a plurality of EEPROM cells;

a comparator having a first input receiving said arbitrary source voltage, a second input receiving a first reference voltage within said prespecified voltage range, and an output providing a control signal indicative of a comparison of said arbitrary source voltage to said first reference voltage; and a voltage generation circuit responsive to said control signal to generate a plurality of voltages for programming, reading, and erasing said plurality of EEPROM cells such that the respective magnitudes of said plurality of voltages for programming, reading, and erasing said EEPROM cells are substantially same values for any received source voltage within said prespecified voltage range.

2. The flash EEPROM system as recited in claim 1, wherein said voltage generation circuit comprises:

means responsive to said control signal, for generating a high voltage from said arbitrary source voltage such that a magnitude of said high voltage is substantially a same value for any received source voltage within said prespecified voltage range; and means for generating from said source voltage and said high voltage, said plurality of voltages for programming, reading, and erasing said EEPROM cells.

3. The flash EEPROM system as recited in claim 2, wherein said high voltage generating means comprises a regulated charge pump circuit.

4. The flash EEPROM system as recited in claim 3, wherein said regulated charge pump comprises:

a charge pump circuit including a plurality of energy storing elements connected to said arbitrary source voltage such that energy from said arbitrary source voltage is transferred between adjacent ones of said plurality of energy storing elements so as to generate an output voltage greater than said arbitrary source voltage; and means responsive to said control signal and connected to at least two of said plurality of energy storing elements, for stopping a transfer of energy from one to the other of said at least two energy storing elements and transfering energy from an energy source to the other of said at least two energy storing elements while said control signal is in a first logic state.

5. The flash EEPROM system as recited in claim 4, wherein said regulated charge pump further comprises:

means responsive to a feedback control signal and connected to said at least two of said plurality of energy storing elements for stopping a transfer of energy from one to the other of said at least two energy storing elements when said feedback control signal is in said first logic state; and means for generating said feedback control signal such that said feedback control signal is only in said first logic state while said output voltage is greater than a second reference voltage by a fixed factor.

6. The flash EEPROM system as recited in claim 5, wherein said second reference voltage is a bandgap reference voltage.

7. The flash EEPROM system as recited in claim 2, further comprising a controller processor, wherein said plurality of voltages generating means comprises:

a plurality of registers respectively storing information indicative of a plurality of voltages suitable for programming, reading, and erasing said EEPROM cells, wherein said information is stored in said plurality of registers by said controller processor and adjusted by said controller processor in response to said control signal; and a plurality of digital-to-analog converters connected to said high voltage generating means and individually to corresponding ones of said plurality of registers to generate corresponding analog output voltages generally proportional to the information stored in said corresponding ones of said plurality of registers.

8. A self-adaptive voltage generation circuit operative within a continuous voltage source range for generating a plurality of voltages for programming, reading, and erasing a flash EEPROM, comprising:

means for receiving an arbitrary source voltage within said continuous voltage source range, and generating a control signal indicative of a subrange, including the voltage of said received arbitrary source voltage, of said continuous voltage source range; and means responsive to said control signal, for generating from said arbitrary source voltage, said plurality of voltages for programming, reading, and erasing a flash EEPROM such that the respective magnitudes of said plurality of voltages for programming, reading, and erasing said flash EEPROM are substantially same values for any received arbitrary source voltage within said continuous voltage source range.

9. The self-adaptive voltage generation circuit as recited in claim 8, wherein said control signal generating means comprises a comparator circuit including a first input connected to said arbitrary source voltage, a second input connected to a reference voltage associated with a subrange of said continuous voltage source range, and an output providing said control signal.

10. The self-adaptive voltage generation circuit as recited in claim 9, wherein said comparator circuit generates said control signal such that said control signal is in a first logic state when said arbitrary source voltage is less than said reference voltage, and in a second logic state when said arbitrary source voltage is greater than said reference voltage.

11. The self-adaptive voltage generation circuit as recited in claim 8, wherein said plurality of voltages generating means comprises:

means responsive to said control signal, for generating a high voltage from said arbitrary source voltage such that a magnitude of said high voltage is substantially a same value for any received arbitrary source voltage within said continuous voltage source range; and means for generating from said arbitrary source voltage and said high voltage, said plurality of voltages for programming, reading, and erasing a flash EEPROM.

12. The self-adaptive voltage generation circuit as recited in claim 11, wherein said plurality of voltages generating means further comprises means responsive to said control signal, for generating from said arbitrary source voltage and said high voltage, said plurality of voltages for programming, reading, and erasing a flash EEPROM such that the respective magnitudes of said plurality of voltages for programming, reading, and erasing a flash EEPROM are substantially same values for any received source voltage within said continuous voltage source range.

13. The self-adaptive voltage generation circuit as recited in claim 12, wherein said plurality of voltages generating means comprises:

a plurality of registers respectively storing information indicative of a plurality of voltages suitable for programming, reading, and erasing a flash EEPROM;

a plurality of digital-to-analog converters connected to said high voltage generating means and individually to corresponding ones of said plurality of registers to generate corresponding analog output voltages proportional to the information stored in said corresponding ones of said plurality of registers; and means connected to said control signal generating means and said plurality of registers, for storing in said plurality of registers, information indicative of a plurality of voltages suitable for programming, reading, and erasing a flash EEPROM, wherein the information stored in said plurality of registers is adjusted in response to said control signal.

14. The self-adaptive voltage generation circuit as recited in claim 11, wherein said high voltage generating means comprises a regulated charge pump circuit.

15. The self-adaptive voltage generation circuit as recited in claim 13, wherein said regulated charge pump comprises:

a charge pump circuit including a plurality of energy storing elements connected to said arbitrary source voltage such that energy from said arbitrary source voltage is transferred between adjacent ones of said plurality of energy storing elements so as to generate an output voltage greater than said arbitrary source voltage; and means responsive to said control signal and connected to at least two of said plurality of energy storing elements, for stopping a transfer of energy from one to the other of said at least two energy storing elements and transfering energy from an energy source to the other of said at least two energy storing elements while said control signal is in said first logic state.

16. The self-adaptive voltage generation circuit as recited in claim 15, wherein said regulated charge pump further comprises:

means responsive to a feedback control signal and connected to said at least two of said plurality of energy storing elements for stopping a transfer of energy from one to the other of said at least two energy storing elements when said feedback control signal is in said first logic state; and means for generating said feedback control signal such that said feedback control signal is only in said first logic state while said output voltage is greater than a reference voltage by a fixed factor.

17. The self-adaptive voltage generation circuit as recited in claim 16, wherein said reference voltage is a bandgap reference voltage.

18. A self-adaptive voltage generation circuit operative within a continuous voltage source range for generating a plurality of voltages for programming, reading, and erasing a flash EEPROM, comprising:

a comparator circuit having a first input connected to an arbitrary source voltage provided to said self-adaptive voltage generation circuit, and at least one second input respectively receiving at least one reference voltage respectively associated with a subrange range of said continuous voltage source range, and having an output providing at least one control signal indicative of a comparison between said received arbitrary source voltage and said received at least one reference voltage; and a voltage generation circuit connected to said comparator circuit and having a first input connected to said arbitrary source voltage provided to said self-adaptive voltage generation circuit, and at least one second input respectively connected to said at least one control signal, and a plurality of outputs respectively providing said plurality of voltages for programming, reading, and erasing a flash EEPROM such that magnitudes of said plurality of voltages are respectively substantially same values for different connected source voltages within said continuous voltage source range.

19. The self-adaptive voltage generation circuit as recited in claim 18, wherein said plurality of voltages generating means comprises:

means responsive to said control signal, for generating a high voltage from said arbitrary source voltage such that a magnitude of said high voltage is substantially a same value for any received source voltage within said continuous voltage source range; and means responsive to said control signal, for generating from said arbitrary source voltage and said high voltage, said plurality of voltages for programming, reading, and erasing a flash EEPROM such that the respective magnitudes of said plurality of voltages for programming, reading, and erasing a flash EEPROM are substantially same values for any received source voltage within said continuous voltage source range.

20. The self-adaptive voltage generation circuit as recited in claim 19, wherein said high voltage generating means comprises a regulated charge pump circuit.

21. The self-adaptive voltage generation circuit as recited in claim 20, wherein said regulated charge pump comprises:

a charge pump circuit including a plurality of energy storing elements connected to said arbitrary source voltage such that energy from said arbitrary source voltage is transferred between adjacent ones of said plurality of energy storing elements so as to generate an output voltage greater than said arbitrary source voltage; and means responsive to said control signal and connected to at least two of said plurality of energy storing elements, for stopping a transfer of energy from one to the other of said at least two energy storing elements and transfering energy from an energy source to the other of said at least two energy storing elements while said control signal is in a first logic state.

22. The self-adaptive voltage generation circuit as recited in claim 21, wherein said regulated charge pump further comprises:

means responsive to a feedback control signal and connected to said at least two of said plurality of energy storing elements for stopping a transfer of energy from one to the other of said at least two energy storing elements when said feedback control signal is in said first logic state; and means for generating said feedback control signal such that said feedback control signal is only in said first logic state while said output voltage is greater than a bandgap reference voltage by a fixed factor.

23. The self-adaptive voltage generation circuit as recited in claim 19, wherein said plurality of voltages generating means comprises:

a plurality of registers respectively storing information indicative of a plurality of voltages suitable for programming, reading, and erasing a flash EEPROM;

a plurality of digital-to-analog converters connected to said high voltage generating means and individually to corresponding ones of said plurality of registers to generate corresponding analog output voltages proportional to the information stored in said corresponding ones of said plurality of registers; and means connected to said comparator and said plurality of registers, for storing in said plurality of registers, information indicative of a plurality of voltages suitable for programming, reading, and erasing a flash EEPROM, wherein the information stored in said plurality of registers is adjusted in response to said control signal.

24. The self-adaptive voltage generation circuit as recited in claim 23, wherein said information storing means comprises a controller processor.

25. In an EEPROM device, a voltage regulated charge pump circuit comprising:

a charge pump circuit including a plurality of energy storing elements connected to a power source providing an input voltage to said plurality of energy storing elements such that energy from said power source is transferred between adjacent ones of said plurality of energy storing elements so as to generate an output voltage greater than said input voltage at an output of said charge pump circuit;

means responsive to a feedback control signal and connected to at least two of said plurality of energy storing elements for stopping a transfer of energy from one to the other of said at least two energy storing elements when said feedback control signal is in a first logic state; and means for generating said feedback control signal such that said feedback control signal is only in a first logic state while said output voltage is greater than a reference voltage by a fixed factor.

26. The voltage regulated charge pump circuit as recited in claim 25, wherein said feedback control signal generating means comprises:

a voltage divider circuit connected to said output voltage so as to generate a feedback voltage which is a fraction of said output voltage, wherein said fraction is inversely related to said fixed factor; and comparator means for comparing said feedback voltage to said reference voltage, and generating said feedback control signal such that said feedback control signal is in said first logic state when said feedback voltage is greater than said reference voltage.

27. The voltage regulated charge pump circuit as recited in claim 26, wherein said transfer of energy stopping means comprises a transistor having source and drain connected between an adjacent pair of said at least two adjacent energy storing elements, and a control gate connected to said feedback control signal.

28. The voltage regulated charge pump circuit as recited in claim 25, further comprising means responsive to a control Signal and connected to at least two of said plurality of energy storing elements, for stopping a transfer of energy from one to the other of said at least two energy storing elements and transfering energy from an energy source to the other of said at least two energy storing elements while said control signal is in said first logic state.

29. The voltage regulated charge pump circuit as recited in claim 28, wherein said energy source is said power source.

30. In an EEPROM device, a voltage regulated charge pump comprising:

a plurality of voltage doubler circuits, wherein a 1st one of said voltage doubler circuits receives a voltage Vdd and generates, in response to a first clock signal, a first output voltage substantially equal to 2*Vdd during odd phases of said first clock signal and Vdd during even phases of said first clock signal, and a last one of said voltage doubler circuits designated as an nth one of said voltage doubler circuits receives a first (n−1)th output voltage of a second to last one of said voltage doubler circuits designated as an (n−1)th one of said voltage doubler circuits and generates, in response to said first clock signal, a first nth output voltage substantially equal to $2^n$*Vdd during said odd phases of said first clock signal and $2^{(n-1)}$*Vdd during said even phases of said first clock signal;

means responsive to a feedback control signal and connected to said (n−1)th and nth ones of said voltage doubler circuits, for electrically disconnecting said (n−1)th one of said voltage doubler circuits from said nth one of said voltage doubler circuits such that said nth voltage doubler circuit does not receive said first (n−1)th output voltage of said (n−1)th one of said voltage doubler circuits while said feedback control signal is in a first logic state; and means for generating said feedback control signal such that said feedback control signal is only in said first logic state while said first nth output voltage is greater than a reference voltage by a fixed factor.

31. The voltage regulated charge pump circuit as recited in claim 30, wherein said feedback control signal generating means comprises:

a voltage divider circuit connected to said first nth output voltage so as to generate a feedback voltage which is a fraction of said first nth output voltage, wherein said fraction is inversely related to said fixed factor; and comparator means for comparing said feedback voltage to said reference voltage, and generating said feedback control signal such that said feedback control signal is in said first logic state when said feedback voltage is greater than said reference voltage.

32. The voltage regulated charge pump circuit as recited in claim 31, wherein said transfer of energy stopping means comprises a first transistor having a control gate connected to said feedback control signal, and drain and source electrodes connected between said (n−1)th and nth voltage doubler circuits such that said nth voltage doubler circuit does not receive said first (n−1)th output voltage of said (n−1)th voltage doubler circuit while said feedback control signal is in said first logic state.

33. A method of generating a plurality of voltages for programming, reading, and erasing a plurality of flash EEPROM cells, comprising the steps of:

comparing a source voltage against at least one reference voltage indicative of at least one corresponding subrange within a continuous voltage source range, and generating at least one corresponding control signal in response to such comparison;

adjusting the open loop gain of a regulated charge pump in response to said at least one corresponding control signal such that an output voltage of said regulated charge pump remains substantially the same for source voltages within said continuous voltage source range; and generating said plurality of voltages for programming, reading, and erasing said plurality of flash EEPROM cells from said output voltage of said regulated charge pump.

34. The method as recited in claim 33, wherein said generating step comprises the steps of:

storing information indicative of said plurality of voltages for programming, reading, and erasing said EEPROM cells into a plurality of registers;

converting the information stored in said plurality of registers into a corresponding plurality of voltages for programming, reading, and erasing said EEPROM cells; and modifying the information stored in said plurality of registers in response to said control signal so that the plurality of voltages generated by converting the information remain substantially the same.

* * * * *